United States Patent
Raju et al.

(10) Patent No.: US 9,281,885 B2
(45) Date of Patent: Mar. 8, 2016

(54) REORDERING OF A BEAMFORMING MATRIX BASED ON ENCODING

(71) Applicant: Imagination Technologies, Limited, Kings Langley (GB)

(72) Inventors: Meesaraganda Surendra Raju, Bangalore (IN); Sujai Chari, Burlingame, CA (US)

(73) Assignee: Imagination Technologies, LLC (GB)

( * ) Notice: Subject to any disclaimer, the term of this patent is extended or adjusted under 35 U.S.C. 154(b) by 0 days.

(21) Appl. No.: 14/476,550

(22) Filed: Sep. 3, 2014

(65) Prior Publication Data
US 2015/0288437 A1    Oct. 8, 2015

Related U.S. Application Data

(60) Provisional application No. 61/976,070, filed on Apr. 7, 2014.

(51) Int. Cl.
| | |
|---|---|
| *H04B 1/38* | (2015.01) |
| *H04L 5/16* | (2006.01) |
| *H04B 7/04* | (2006.01) |
| *H04B 7/06* | (2006.01) |
| *H04L 1/00* | (2006.01) |

(52) U.S. Cl.
CPC ............ *H04B 7/0486* (2013.01); *H04B 7/0456* (2013.01); *H04B 7/0617* (2013.01); *H04B 7/0634* (2013.01); *H04L 1/0071* (2013.01); *H04L 1/0045* (2013.01); *H04L 1/0057* (2013.01); *H04L 1/0059* (2013.01)

(58) Field of Classification Search
CPC .. H04B 7/0486; H04B 7/0617; H04L 1/0071; H04L 1/0059
USPC .......................................................... 375/219
See application file for complete search history.

(56) References Cited

U.S. PATENT DOCUMENTS

| | | | |
|---|---|---|---|
| 6,697,633 B1 * | 2/2004 | Dogan | G01S 3/74 455/450 |
| 2007/0201575 A1 | 8/2007 | Ariyavisitakul et al. | |
| 2008/0043873 A1 | 2/2008 | Ariyavisitakul | |

(Continued)

FOREIGN PATENT DOCUMENTS

GB    2434946    8/2007

OTHER PUBLICATIONS

GB1504416.7; Combined Search and Examination Report under Sections 17 and 18(3).

(Continued)

*Primary Examiner* — Nader Bolourchi
(74) *Attorney, Agent, or Firm* — Brian R. Short

(57) ABSTRACT

Apparatuses, methods and systems for beamforming based on encoding are disclosed. One embodiment of a method includes generating a beamforming matrix, including obtaining a channel matrix of a multiple-input, multiple-output (MIMO) channel between multiple transmitter antennas and at least one receiver antenna, determining an initial beamforming matrix based on a singular value decomposition of the channel matrix, and generating, by a transceiver, a final beamforming matrix comprising reordering columns of the initial beamforming matrix for at least one sub-carrier of a multi-carrier signal, wherein the reordering of the columns is based on knowledge of encoding of a transmit signal.

31 Claims, 8 Drawing Sheets

(56) References Cited

U.S. PATENT DOCUMENTS

| | | |
|---|---|---|
| 2008/0080634 A1 | 4/2008 | Kotecha |
| 2008/0304463 A1* | 12/2008 | Borkar ............... H04B 7/0417 370/342 |
| 2008/0304464 A1 | 12/2008 | Borkar |
| 2009/0102715 A1 | 4/2009 | Lou |
| 2009/0221241 A1* | 9/2009 | Ghosh ............... H01Q 3/26 455/69 |
| 2009/0304103 A1 | 12/2009 | Vaidyanathan |
| 2010/0150260 A1 | 6/2010 | Ariyavisitakul et al. |
| 2010/0226456 A1 | 9/2010 | Ariyavisitakul |
| 2011/0080972 A1 | 4/2011 | Xi |
| 2012/0045003 A1* | 2/2012 | Li ............... H04B 7/0641 375/260 |
| 2013/0044683 A1* | 2/2013 | Maltsev ............... H04B 7/0404 370/328 |
| 2013/0077514 A1 | 3/2013 | Dinan |
| 2014/0056334 A1 | 2/2014 | Khina et al. |
| 2014/0153662 A1* | 6/2014 | Lin ............... H04B 7/0617 375/267 |

OTHER PUBLICATIONS

GB1504417.7; Combined Search and Examination Report under Sections 17 and 18(3).

Ismail, M.R., "Exploiting Irregular Variable Node Degree in a MIMO System", IEEE ICCS 2006, pp. 1-5, Singapore, Oct. 2006.

* cited by examiner

US 9,281,885 B2

REORDERING OF A BEAMFORMING MATRIX BASED ON ENCODING

RELATED APPLICATIONS

This patent application claims the benefit of U.S. Provisional Patent Application Ser. No. 61/976,070 filed Apr. 7, 2014, which is herein incorporated by reference.

FIELD OF THE DESCRIBED EMBODIMENTS

The described embodiments relate generally to wireless communications. More particularly, the described embodiments relate to systems, methods and apparatuses for reordering a beamforming matrix based on encoding.

BACKGROUND

Transmit beamforming techniques have been used in many variations in multiple-input, multiple-output (MIMO) systems. Typically, these techniques include the computation of a beamforming matrix at a receiver based on a measurement of the transmission (MIMO) channel. When the matrix is communicated to the transmitter and applied by the transmitter on subsequent traffic, the effective received signal-to-noise ratio (SNR) for each stream in the MIMO system is improved resulting in improved overall performance. While these solutions offer performance improvement by improving the effective SNR at the receiver, the interaction between the distributions of SNRs across multiple antenna chains and subcarriers, for different decoding and demapping processes, and for data stream parsing and de-parsing are not considered. These interactions can lead to substantially degraded performance compared to theoretically expected results.

SUMMARY

An embodiment includes a method of beamforming based on encoding. The method includes generating a beamforming matrix, including obtaining a channel matrix of a multiple-input, multiple-output (MIMO) channel between multiple transmitter antennas and at least one receiver antenna, determining an initial beamforming matrix based on a singular value decomposition of the channel matrix, and generating, by a transceiver, a final beamforming matrix comprising reordering columns of the initial beamforming matrix for at least one sub-carrier of a multi-carrier signal, wherein the reordering of the columns is based on knowledge of encoding of a transmit signal.

At least some embodiments further include processing a plurality of multi-carrier signals using the final beamforming matrix, and transmitting the processed plurality of multi-carrier signals through a plurality of transmitter chains.

Another embodiment includes an apparatus. The apparatus includes a plurality of receive chains, and a processor. The processor is operative to obtain a channel matrix of a multiple-input, multiple-output (MIMO) channel between multiple transmitter antennas and at least one receiver antenna, determine an initial beamforming matrix based on a singular value decomposition of the channel matrix, and generate, by a transceiver, a final beamforming matrix comprising reordering columns of the initial beamforming matrix for at least one sub-carrier of a multi-carrier signal, wherein the reordering of the columns is based on knowledge of encoding of a transmit signal.

For at least some embodiments, the transceiver includes the multiple transmitter antennas, and the processor is further operative to facilitate processing of a plurality of multi-carrier signals using the final beamforming matrix, and the transceiver is operative to transmit the processed plurality of multi-carrier signals through a plurality of transmit chains.

For at least some embodiments, the transceiver is further operative to transmit the final beamforming matrix through a transmit chain back to a second transceiver that includes the multiple transmitter antennas.

Other aspects and advantages of the described embodiments will become apparent from the following detailed description, taken in conjunction with the accompanying drawings, illustrating by way of example the principles of the described embodiments.

DETAILED DESCRIPTION

The embodiments described include methods, apparatuses, and systems for reducing the implementation loss (that is, performance loss relative to a theoretical limit) of beamforming resulting from the interaction between the signal-to-noise-ratios (SNRs) across multiple antenna chains and subcarriers, the decoding and demapping, and/or stream parsing and de-parsing processes of multi-carrier, multiple-input, multiple-output (MIMO) communications. At least some embodiments include dynamically adjusting computation of a beamforming matrix based on encoding of a transmit signal. At least some specific embodiments include interplay between a measured MIMO channel, the demapping and decoding, stream parsing and/or de-parsing processes resulting in better performance (that is, lower Packet Error Rate) than traditional MIMO beamforming techniques.

At least some embodiments include determining a final beamforming matrix by a processor of a transceiver reordering columns of an initial transmit matrix. For one embodiment, the transceiver transmits the final beamforming matrix back to second transceiver that applies the final transmit matrix to multiple spatial transmit streams. For another embodiment, the transceiver applies the final transmit matrix to multiple spatial transmit streams of the transceiver.

Figure 1:
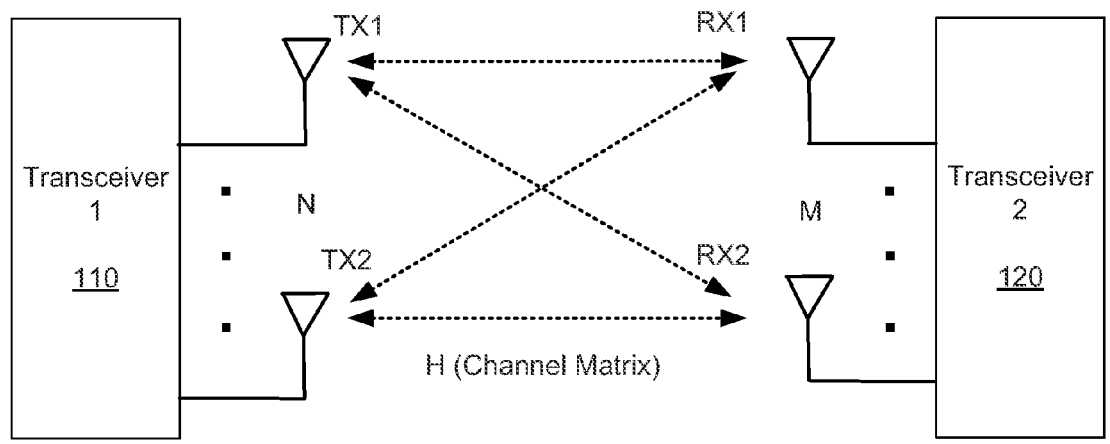
FIG. 1 shows a first transceiver, a second transceiver, and a MIMO transmission channel between the transceivers, according to an embodiment.

FIG. 1 shows a first transceiver 110, a second transceiver 120, and a MIMO transmission channel between the transceivers 110, 120, according to an embodiment. As shown, the first transceiver 110 includes N antennas transmitting communication signals, and the second transceiver 120 includes M antennas receiving communications signals. Accordingly, the transmission channel between the first transceiver 110 and the second transceiver 120 can be characterized by an M×N channel matrix H.

For an embodiment, the transmission signals between the first transceiver 110 and the second transceiver 120 include multi-carrier modulation signals. Multi-carrier modulation (MCM) is a method of transmitting data by splitting it into several components, and sending each of these components over separate carrier signals. The individual carriers have narrow bandwidth, but the composite signal can have broad bandwidth. The advantages of MCM include relative immunity to fading caused by transmission over more than one path at a time (multipath fading), less susceptibility than single-carrier systems to interference caused by impulse noise, and enhanced immunity to inter-symbol interference.

An exemplary form of MCM includes orthogonal frequency-division multiplexing (OFDM). OFDM is essentially identical to coded OFDM (COFDM) and discrete multi-tone modulation (DMT), and is a frequency-division multiplexing (FDM) scheme used as a digital multi-carrier modulation method. The primary advantage of OFDM over single-carrier schemes is its ability to cope with severe channel conditions (for example, narrowband interference and frequency-selective fading due to multipath) without complex equalization filters. Channel equalization is simplified because OFDM may be viewed as using many slowly modulated narrowband signals rather than one rapidly modulated wideband signal. The low symbol rate makes the use of a guard interval between symbols affordable, making it possible to eliminate intersymbol interference (ISI) and utilize echoes and time-spreading to achieve a diversity gain, that is, a signal-to-noise ratio improvement.

An embodiment includes obtaining a channel matrix H per sub-carrier of a multi-carrier signal. For an embodiment, the channel matrix is determined at the receiver, and communicated back to the transmitter. However, for another embodiment, the channel matrix is determined at the transmitter. That is, by assuming reciprocity of the transmission channel, signals received by the transmitting transceiver from the receiving transmitter can be used to determine the channel matrix H.

An embodiment includes performing a SVD (singular value decomposition) matrix decomposition $H=USV^H$ for each subcarrier. That is, the SVD decomposition is based on the previously described channel matrix H. For an embodiment of the SVD matrix decomposition:

U is a left singular vector matrix;
S is a singular value matrix; and
V is a right singular vector matrix (for an embodiment, this is the beamforming matrix applied at the transmitter).

It is to be noted, that for at least some of the described embodiments, S is diagonal matrix with each of the diagonal values corresponding to a singular value. Further, there are many possible methods to realize the decomposition. Depending on the technique, different ordering of singular values (that is, the diagonal elements of the S matrix) can result. For an embodiment, the diagonal elements increase in magnitude traversing down the diagonal of the S matrix. For another embodiment, the diagonal elements decrease in magnitude traversing down the diagonal of the S matrix. Without loss of generality, at least some of the described embodiments assume that the diagonal elements of S are in decreasing order traversing down the diagonal.

For at least some embodiments, the right singular vector matrix, V, is used as an initial beamforming matrix. If this matrix is applied at the transmitter, then the effective channel seen at the receiver is $H*V=USV^HV=US$. The received signal at a particular subcarrier can be denoted as $Y=HVX+N$, where VX is the beam-formed transmitted data and N is the additive noise. Since U is orthonormal, after pre-multiplication of Y by $U^H$ at the receiver, the effective received vector can written as $Y_{eff}=U^HY=SX+U^HN$. Thus, since S is diagonal, each of the multiple transmitted streams can be detected independently. Additionally, the signal quality or SNR on each stream is determined by the corresponding singular value. For instance, if there are two transmitted streams in a 2×2 system, a first transmitted stream's SNR is based on the first singular value of S (that is, S(1, 1)) and a second transmitted stream's SNR is based on the second singular value of S (that is, S(2, 2)). If the streams are decoded completely independently, the link performance is dictated by the stream with the worse SNR. Since the channel can be different for each subcarrier in an OFDM system, if the higher of the two SNRs resulting from the singular values of the S matrix for each subcarrier can be distributed between the streams evenly, then the resulting discrepancy in average SNR across both streams could be reduced, thereby improving the error of the worst stream and hence improving overall link performance.

Even for the case where the streams are jointly decoded, judiciously distributing the higher/highest SNRs among the streams across the subcarriers can improve the overall link performance.

Reordering the columns of the initial beamforming matrix is one method of generating a final beamforming matrix which can be used to multiply the transmit data and thereby improve link performance compared to using the initial beamforming matrix to multiply the transmit data.

Figure 2:
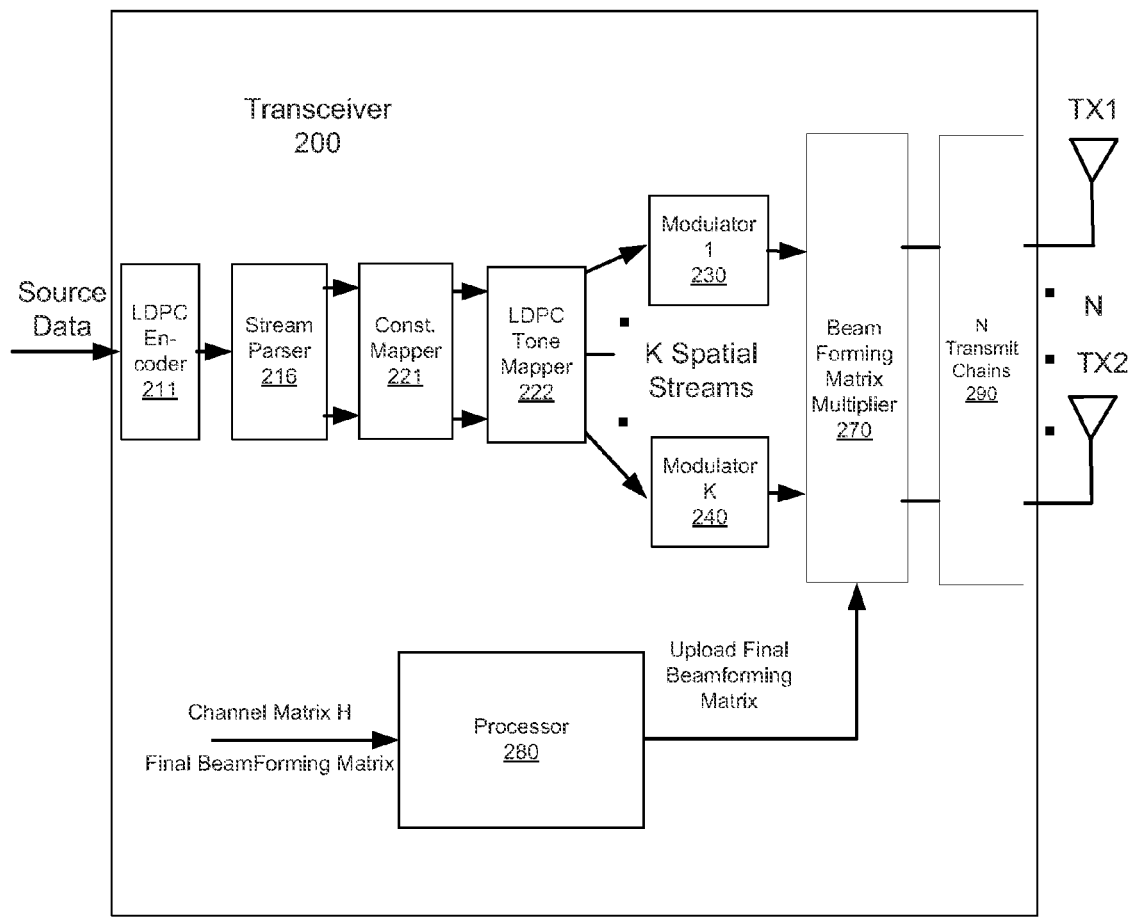
FIG. 2 shows a transmitter of a transceiver that includes K spatial streams, N transmit antennas, and beamforming processing, according to an embodiment.

FIG. 2 shows a transmitter of a transceiver 200 that includes K spatial streams, N transmit antennas, and beamforming processing, according to an embodiment. As shown, a stream of data (source data) is received by the transmitter portion, which is encoded by an LDPC encoder 211, parsed into multiple (K) spatial data streams by a parser 216, mapped to a constellation using a constellation mapper 221 and the constellation points are subsequently mapped to subcarriers using an LDPC tone mapper 222. The plurality of K spatial streams includes N modulators 230, 240. Multiplication of the K spatial streams by a beamforming matrix 270 results in the data which is transmitted by N transmit chains 290 from the N multiple transmit antennas TX1, TX2 . . . TXN.

For an embodiment, the final beamforming matrix is determined elsewhere (for example, at a receiver of the K spatial streams) and then communicated to the transmitter. Based on the channel matrix H and the final beamforming matrix, a processor 280 of the transceiver 200 uploads the coefficients of the final beamforming matrix to a beamforming matrix multiplier 270. For another embodiment, the final beamforming matrix is generated at the transmitter if the previously describe reciprocity of the transmission channel is assumed. It is to be understood that while the beamforming matrix multiplier is 270 depicted as a separate functional block, for at least some embodiments that processing provided by the beamforming matrix multiplier is 270 is incorporated into the processing of the processor 280. For at least some embodiments, the processor 280 facilitates the processing.

For at least some embodiments, generating the final beamforming matrix includes obtaining the channel matrix (H) of a multiple-input, multiple-output (MIMO) channel between a multiple antenna transmitter and a receiver, determining an initial beamforming matrix based on a singular value decomposition of the channel matrix. Finally, the final beamforming matrix is generated by reordering columns of the initial beamforming matrix for at least one sub-carrier of a multi-carrier signal based on knowledge of encoding of a transmit signal.

Once the final beamforming matrix has been generated, a plurality of multi-carrier signals are processed using the final beamforming matrix (that is, for example, through the beamforming matrix multiplier 270), and the processed plurality of multi-carrier signals are transmitted through a plurality of transmit chains of the multiple antenna transmitter.

Reordering of Columns of the Initial Beamforming Matrix

For an embodiment, one or more of various signal characteristics can be used for determining how to re-order columns of the initial beamforming matrix. For an embodiment, the reordering of the columns is dependent on the modulation and coding schemes used for transmission. For at least some embodiments, the reordering of the columns is performed on a sub-carrier basis of the multi-carrier transmission signal.

Figure 3:
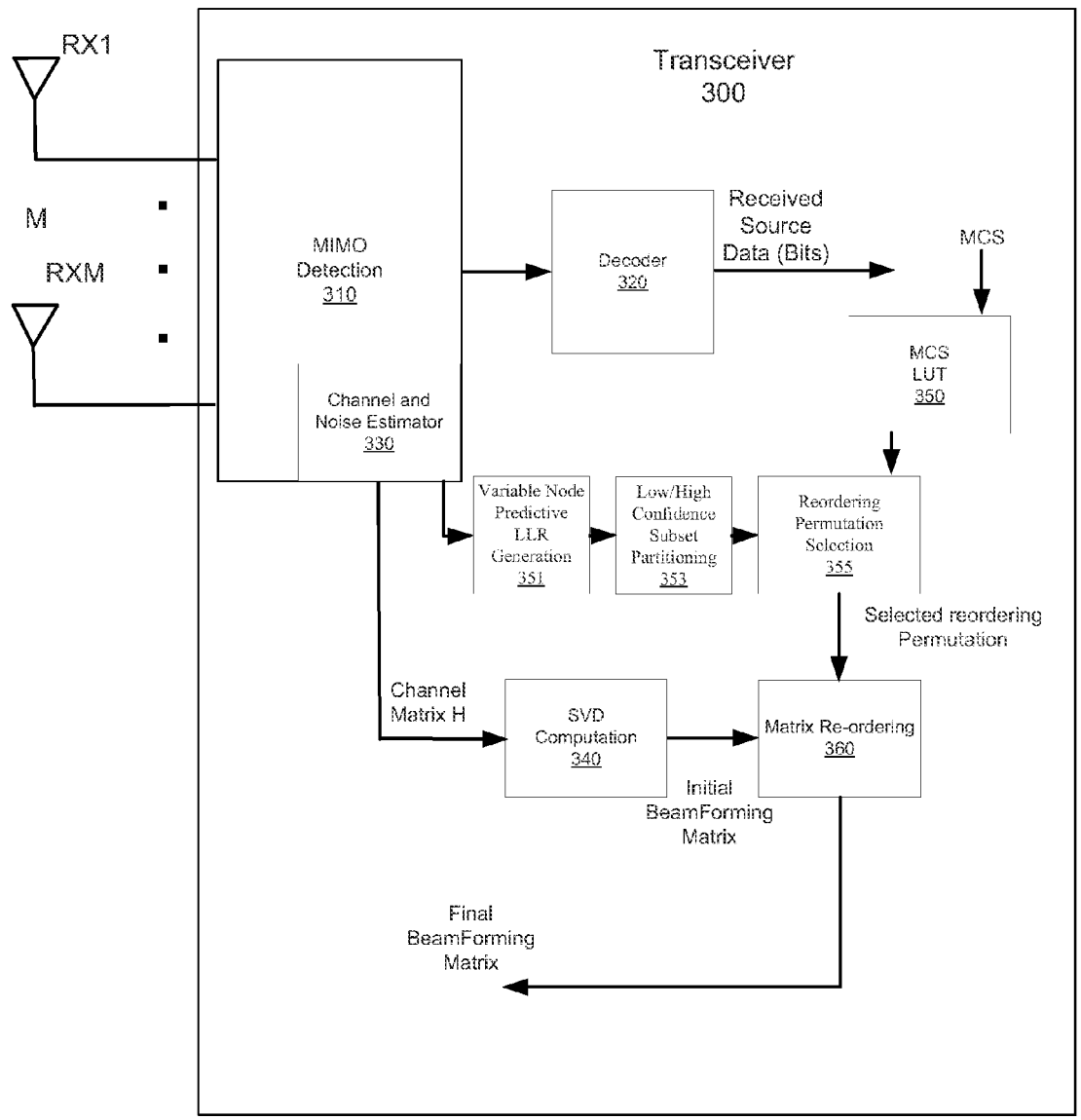
FIG. 3 shows a receiver portion of a transceiver that includes M receiver antennas, and beamforming matrix processing, according to an embodiment.

FIG. 3 shows a receiver portion of a transceiver 300 that includes M receive antennas, and beamforming matrix processing, according to an embodiment. For this embodiment, the receiver portion of a receiving transceiver performs the processing and determination of the final beamforming matrix. As shown, the receiver includes M receive antennas (RX1-RXM) that receive the K spatial streams transmitted by the transmitting transceiver.

A MIMO detector 310 processes the received signals, and generates a received bit stream. A decoder 320 decodes the received bit stream, ideally yielding the K spatially separate streams of bits. Processing the received signals, includes estimation of the channel and noise (330) which is subsequently used to equalize and decode the signal resulting in the decoded bit stream.

The channel and noise estimator 330 also performs a channel quality estimation, which can be used to determine the modulation and coding schemes used for transmission.

A variable node predictive engine 351 generates predicted LLRs which are partitioned by into low and high confidence subsets by a Low/High confidence subset partitioning engine 353. Based on the partitioning, a selection of a column reordering permutation is made from available column reordering permutations by a reordering permutation selection engine 355.

For an embodiment, the channel and noise estimator 330 generates the channel matrix H.

An SVD decomposition block 340 performs the previously described SVD decomposition, yielding an initial beamforming matrix.

Once the selected reordering permutation been determined, an embodiment includes reordering the columns (360) of the initial beamforming matrix based on the selected permutation.

As described, for embodiments, the initial Singular Value matrix S is re-ordered to S' based on various metrics. For an embodiment, this includes computing a new beamforming matrix V' based on S'. Note that V' is obtained by shuffling the columns of V. So, in practice, S' does not have to be computed/determined. If the desired reordering is known, V' can be obtained from V by shuffling the columns corresponding to the desired reordering. Although the discussion regarding reordering below is described in terms of reordering singular values of the S matrix, the discussion equivalently applies to reordering columns of V as well. One advantage of doing the permutation on V is that the transmitter (which has more direct knowledge of MCS, coding, etc.) can choose permutation based on those parameters.

For an embodiment, the column reordering of the initial beamforming matrix is based on the modulation and coding scheme being used on a transmission packet. If there is a set of known MCS a priori, a lookup table (MCS LUT 350) can be used based on MCS for the current packet, to determine the reordering scheme for the next packet, or a set of next packets.

The described embodiments include different possible reordering schemes for multi-carrier modulation. For an embodiment, selecting a beamforming technique includes singular value decomposition (SVD), wherein an initial beamforming matrix includes at least one of Ascending Value SVD (AVSVD) that includes diagonal singular values in an increasing order, or Descending Value SVD (DVSVD) that includes diagonal singular values in a decreasing order. Further, for an embodiment, if the initial beamforming matrix includes AVSVD, then the final beamforming matrix includes DVSVD, and if the initial beamforming matrix includes DVSVD, then the final beamforming matrix includes AVSVD. That is, for at least some embodiments, all of the sub-carriers of the multi-carrier signals use the conventional SVD (DVSVD) to determine the initial beamforming matrix. That is, singular values in decreasing order.

At least some embodiments include identifying a number of possible permutations of the reordering of columns to be a number N, dividing the total number of subcarriers into N sets, and reordering columns of the initial beamforming matrix according to a one of the N permutations for at least a subset of the N sets. There are several examples of how this embodiment may be realized. For at least some embodiments, alternating sub-carriers use different reordering such that sub-carriers with even indexing have singular values in decreasing order while sub-carriers with odd indexing have singular values in increasing order. For at least some embodiments, a first half of the sub-carriers use the conventional SVD, that is, have singular values in decreasing order while remaining half use modified SVD, that is, have singular values in increasing order. For at least some embodiments, a first half of the sub-carriers use the modified SVD, that is, have singular values in increasing order while remaining half use conventional SVD, that is, have singular values in decreasing order. Although above examples describe reordering using N=2 permutations (increasing order, decreasing order), possible reordering schemes can be extended to larger values of NFor at least some embodiments, the performance of different MCS (modulation and coding schemes) formats can be analyzed with different reordering schemes, such that an optimal reordering scheme exists for each MCS format. This analysis can be used to develop look up tables for further processing.

For example, in the 802.11n/ac system, for the 20 MHz bandwidth case with 2 spatial streams where LDPC coding is used, each of the MCS schemes 0-8 has a preferred reordering scheme among the options discussed previously (i.e. AVSVD, DVSVD, alternating increasing/decreasing, etc.) which perform better when simulated across a large set of dispersive channels. The table below summarizes the modulation and coding rate used for the aforementioned MCS schemes and the preferred reordering scheme when LDPC encoder is used. The MCS and associated transmission signal characteristics are based on the IEEE 802.11ac standard, as depicted in the following table.

| MCS | Modulation | Coding Rate | Preferred singular value ordering |
|---|---|---|---|
| 0 | BPSK | 1/2 | First half of Sub-carriers in Increasing order and remaining half in Decreasing order |
| 1 | QPSK | 1/2 | Alternating singular value ordering on alternating sub-carriers (Even numbered sub-carriers with Decreasing order and Odd numbered sub-carriers in Increasing order) |
| 2 | QPSK | 3/4 | All sub-carriers with Decreasing order |
| 3 | 16-QAM | 1/2 | Alternating singular value ordering on alternating sub-carriers (Even numbered sub-carriers with Decreasing order and Odd numbered sub-carriers in Increasing order) |
| 4 | 16-QAM | 3/4 | Alternating singular value ordering on alternating sub-carriers (Even numbered sub-carriers with Decreasing order and Odd numbered sub-carriers in Increasing order) |
| 5 | 64-QAM | 2/3 | First half of Sub-carriers in Increasing order and remaining half in Decreasing order |
| 6 | 64-QAM | 3/4 | Decreasing |
| 7 | 64-QAM | 5/6 | Alternating singular value ordering on alternating sub-carriers (Even numbered sub-carriers with Decreasing order and Odd numbered sub-carriers in Increasing order) |
| 8 | 256-QAM | 3/4 | Decreasing |

Although each MCS is designated above using modulation and coding rate, there are other elements of the transmission signal such as the mapper, puncturer, parser which all play a role in determining which reordering scheme will improve the performance. The above table chooses among a set of N=4 reordering schemes (increasing, decreasing, alternating, first/second half). However, the performance comparison can be extended to a larger set of reordering schemes including reordering schemes that exploit further knowledge/specifics of the LDPC code.

The reordering schemes described above involve partitioning the subcarriers into sets and using a chosen reordering scheme for each set. Alternatively, the reordering scheme can be chosen more individually on a per subcarrier basis using additional criteria which examine the impact of other elements of the transmitter used to construct the signal such as the Tone Mapper and the parser. Due to the interplay of these elements with the SNR of each subcarrier, certain susceptible portions of the signal fed to the decoder are more likely to cause decoding errors. Identifying such susceptible portions of the signal stream and then adjusting reordering schemes on specific subcarriers which can reduce the likelihood of those susceptible portions, and applying the beamforming matrix based on the adjusted reordering can lead to improved receiver performance.

An embodiment includes cycling through a set of possible S' permutations across adjacent subcarriers and repeat cycle to cover all subcarriers. For at least some embodiments, mean reliabilities of the statistics used in the decision making are increased.

An embodiment includes letting the number of possible permutations of S be some number N. Further, the total number of subcarriers are divided into N contiguous sets. For each set, one permutation of S is used. Again, as noted above, this approach may also lead to higher mean reliabilities (which are a function of the channel LLRs) of the statistics used in the decision making Note that low channel LLR is correlated with a low effective SNR. A simple 2×2 MIMO system can be used to illustrate these described embodiments. For an embodiment, the effective received vector on a chosen subcarrier is given by;

$$Y_{eff} = U^H Y = SX + U^H N$$

Since S is a diagonal matrix of singular values with positive and real values, $s_{11}$ and $s_{22}$ and U is a unitary matrix, the above decomposition provides two parallel channels, that is;

$$y_{eff,stream1} = s_{11} x_1 + n_1$$

$$y_{eff,stream2} = s_{22} x_2 + n_2$$

where, x1 and x2 are the transmitted data on stream 1 and stream 2 respectively, and n1 and n2 are the complex Gaussian noise terms each with variance $\sigma^2$.

Note that the effective SNRs on stream 1 and stream 2 are proportional to $|s_{11}|^2$ and $|s_{22}|^2$ respectively.

To show the relation between SNR and channel LLRs, a simple modulation and coding scheme can be considered, such as MCS0 that uses BPSK modulation. The Log-likelihood ratio for a bit on stream 1 and stream 2 (for the case where the noise is white and Complex Gaussian) can be shown to be;

$$LLR_{stream1} = (4/\sigma^2) \cdot \text{Re}\{y_{eff,stream1} * s_{11}\}$$
$$= (4/\sigma^2) \cdot (s_{11}^2 \cdot \text{Re}\{x_1\} + s_{11} \cdot \text{Re}\{n_1\})$$

$$LLR_{stream2} = (4/\sigma^2) \cdot \text{Re}\{y_{eff,stream2} * s_{22}\}$$
$$= (4/\sigma^2) \cdot (s_{22}^2 \cdot \text{Re}\{x_2\} + s_{22} \cdot \text{Re}\{n_2\})$$

Hence, it can be observed from the above relations, that the LLRs are closely related to the singular values $s_{11}$ and $s_{22}$, and therefore, the SNRs of each stream. Specifically, the SNRs are proportional to the square of the singular values. Additionally, the higher the singular value, the higher the confidence level or equivalently LLR since the transmitted symbol is effectively multiplied by the square of the singular value while the noise is only multiplied by the singular value. An embodiment includes adjusting reordering across subcarriers such that the maximum number of subcarriers across any stream with singular value less than a threshold is minimized.

Figure 4:
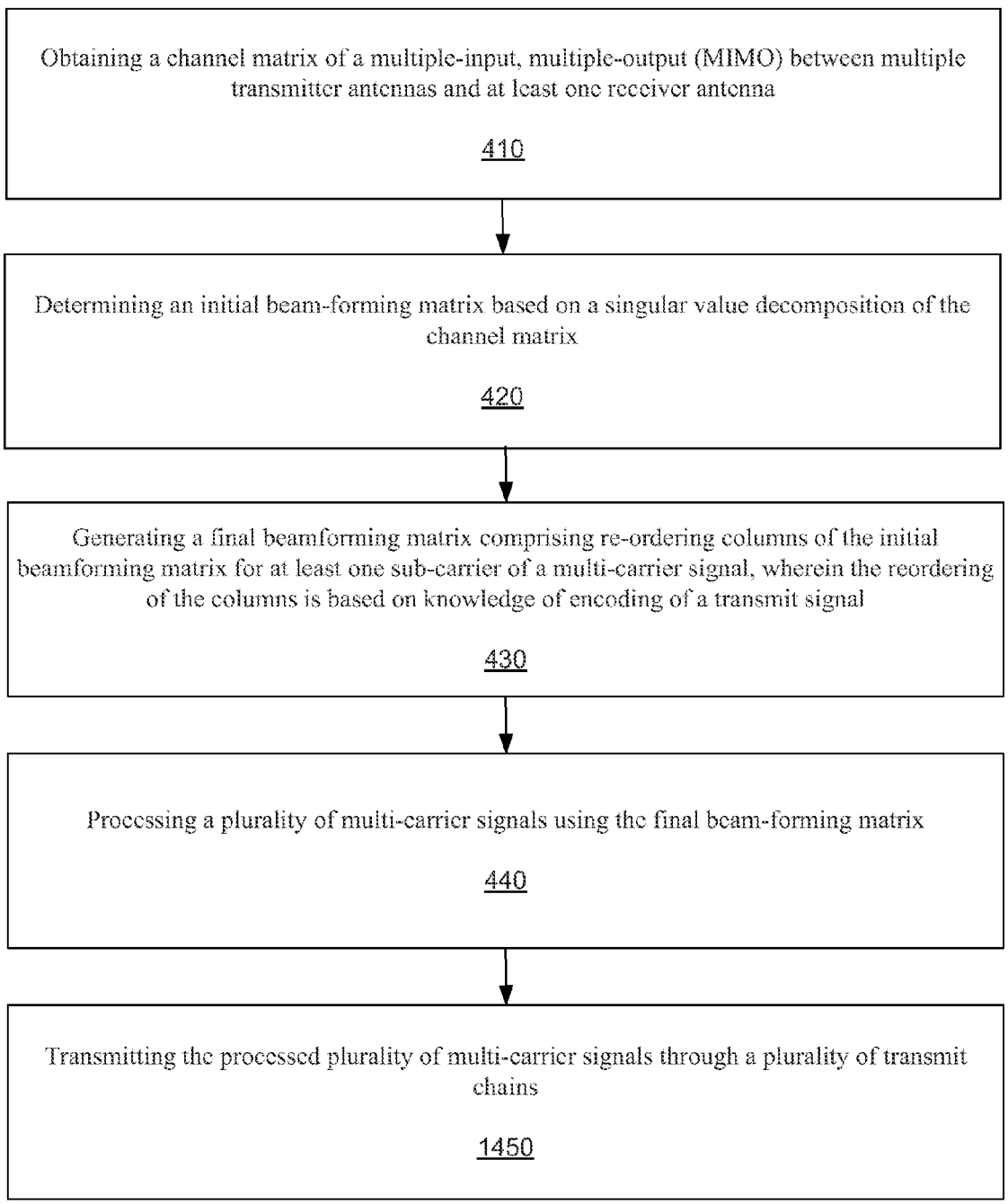
FIG. 4 is a flow chart that includes steps of a method of beamforming based on encoding, according to an embodiment.

FIG. 4 is a flow chart that includes steps of a method of beamforming based on encoding, according to an embodiment. A first step 410 includes obtaining a channel matrix of a multiple-input, multiple-output (MIMO) between a multiple transmitter antennas and at least one receiver antenna. A second step 420 includes determining an initial beamforming matrix based on a singular value decomposition of the channel matrix. A third step 430 includes generating, by a transceiver, a final beamforming matrix comprising reordering columns of the initial beamforming matrix for at least one sub-carrier of a multi-carrier signal, wherein the reordering of the columns is based on knowledge of encoding of a transmit signal.

A fourth step 440 includes processing a plurality of multi-carrier signals using the final beamforming matrix. A fifth step 450 includes transmitting the processed plurality of multi-carrier signals through a plurality of transmit chains. It is to be understood that for an embodiment, the steps 410, 420, 430, 440 and 450 can all be completed within a single transceiver. However, for other embodiments, the steps may be completed at multiple transceivers. For example, steps 410, 420, 430 can be completed at a receiving transceiver, and steps 440, 450 can be completed at a transmitting transceiver. Alternatively, steps 410, 420 can be completed at a receiving transceiver and steps 430, 440, 450 can be completed at a transmitting transceiver.

At least some embodiments further include identifying a set of column reordering permutations, and partitioning every block of n input bit predictive LLRs to an LDPC decoder into a low confidence subset or a high confidence subset for each of the reordering permutations, wherein the LDPC decoder is based on knowledge of LDPC encoding of the transmit signal.

For at least some embodiments, the encoding of the transmit signal includes LDPC encoding. Further, at least some embodiments further include specifying a parity check matrix based on the LDPC encoding, and generating a set of parity check bits, comprising multiplying a block of n input bits by the parity check matrix, wherein the input bits and any information associated with the input bits (that is, LLRs, confidence levels, etc.) are denoted as a variable nodes, and wherein the parity check bits and any information associated with the parity check bits are denoted as check nodes.

Figure 5:
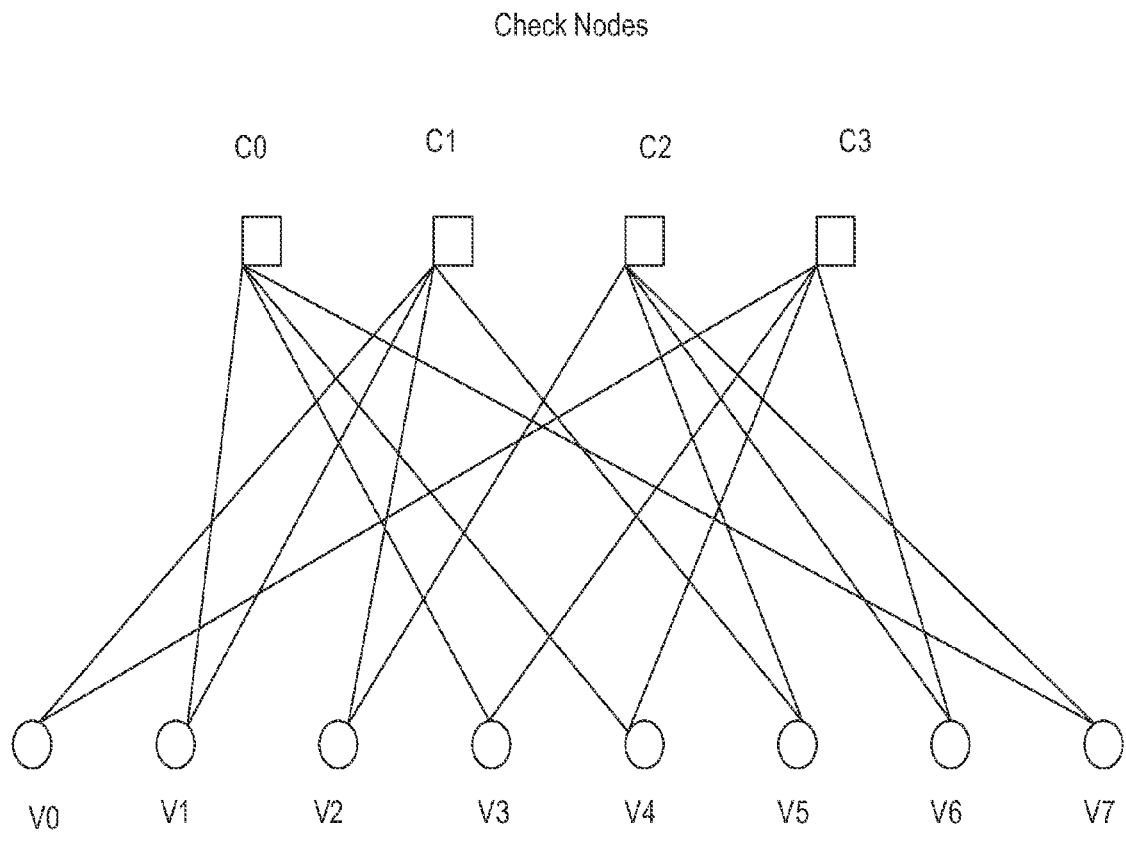
FIG. 5 shows a tanner graph for a parity check matrix that can be utilized for partitioning blocks of n input bit predictive log likelihood ratios (LLRs) to a low-density parity check (LDPC) decoder into a low confidence subset or a high confidence subset for each reordering permutation, according to an embodiment.

A better understanding of the described embodiments that utilize predictive LLRs and metrics for node classification in the LDPC decoder can be obtained by closely looking at the structure of the code and the decoding criterion. FIG. 5 shows a tanner graph for a parity check matrix that can be utilized for partitioning blocks of n input bit predictive LLRs to an LDPC decoder into a low confidence subset or a high confidence subset for each of the reordering permutations, according to an embodiment. This Tanner graph provides a graphical representation of an (8, 4) code. In this graph, the nodes of the graph are separated into two distinctive sets, and edges connect nodes of two different types. The two types of nodes a Tanner graph addresses are variable nodes (bit nodes or V-nodes) and check nodes (or C-nodes). Check node, $C_i$ is connected to variable node $V_j$ if the element $h_{ij}$ of the parity check matrix H is a 1. FIG. 5 shows the tanner graph representation for the above parity check matrix, given by H.

$$H = \begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix}$$

Consider the perspective of the graph from bit node, $V_0$. This bit node is connected to 2 check nodes, $C_1$ and $C_3$ and hence bit node $V_0$ takes part in two parity checks and each of these checks involve three other bit nodes. For example, other bit nodes connected to $C_1$ are $V_1$, $V_2$ and $V_5$ and other bit nodes connected to $C_3$ are bit nodes $V_3$, $V_4$ and $V_6$.

The detector that minimizes the probability of error for the n-th bit, $b_n$ calculates a posterior Log-likelihood ratio (LLR), $\lambda_n$ given by, $$\lambda_n = \log \frac{Pr[b_n = 1 \mid r]}{Pr[b_n = 0 \mid r]},$$

where $r=[r_1, r_2, \ldots r_N]$ is the received vector.

The detector decides $\hat{b}_n = 1$ if $\lambda_n \geq 0$ and $\hat{b}_n = 0$ otherwise. The above can be simplified as $$\lambda_n = \log \frac{f(r_n \mid b_n = 1) \cdot Pr[b_n = 1 \mid \{r_{i \neq n}\}]}{f(r_n \mid b_n = 0) \cdot Pr[b_n = 0 \mid \{r_{i \neq n}\}]}$$

$$= \log \frac{f(r_n \mid b_n = 1)}{f(r_n \mid b_n = 0)} + \log \frac{Pr[b_n = 1 \mid \{r_{i \neq n}\}]}{Pr[b_n = 0 \mid \{r_{i \neq n}\}]}$$

The first term in $\lambda_n$ is called the Intrinsic Information and represents the contribution from the channel observation impacted by the transmitted $b_n$. For convenience, the received sample which is used to determine the LLR for $b_n$ shall be denoted as $r_n$ or equivalently the $n^{th}$ channel observation. The second term represents the contributions from other channel observations apart from the $n^{th}$ observation and is called as the Extrinsic information. Hence the reliability of a particular bit is influenced by both the intrinsic information which is a function of the channel reliability as well as information from other observations.

Assuming that the code bit $b_n$ is involved in exactly j parity checks, numbered 1 through j and say each of the j check nodes involve k-1 other bits.

Letting $b_i=[b_{i,2}, \ldots b_{i,k}]$ denote the set of code bits involved in the $i^{th}$ (i=1 ... j) parity check excluding the code bit, $b_n$, and letting $\Phi(b)$ denote the parity of a set of bits, b. Then, the j parity check constraints involving code bit $b_n$ ensure that $b_n = \Phi(b_i)$, $\forall i=1 \ldots j$. Hence, the result is:

$$\lambda_n = \log \frac{f(r_n \mid b_n = 1)}{f(r_n \mid b_n = 0)} + \log \frac{Pr[\Phi(b_i) = 1, i = 1 \ldots j \mid \{r_{i \neq n}\}]}{Pr[\Phi(b_i) = 0, i = 1 \ldots j \mid \{r_{i \neq n}\}]}$$

Assuming that the code is cycle free, the vectors, $b_i$, i=1 ... j are conditionally independent given as $\{r_{i \neq n}\}$. Hence, the result is:

$$\lambda_n = \log \frac{f(r_n \mid b_n = 1)}{f(r_n \mid b_n = 0)} + \log \frac{\prod_{i=1}^{j} Pr[\Phi(b_i) = 1 \mid \{r_{i \neq n}\}]}{\prod_{i=1}^{j} Pr[\Phi(b_i) = 0 \mid \{r_{i \neq n}\}]}$$

$$= \log \frac{f(r_n \mid b_n = 1)}{f(r_n \mid b_n = 0)} + \sum_{i=1}^{j} \log \frac{Pr[\Phi(b_i) = 1 \mid \{r_{i \neq n}\}]}{Pr[\Phi(b_i) = 0 \mid \{r_{i \neq n}\}]}$$

$$= \log \frac{f(r_n \mid b_n = 1)}{f(r_n \mid b_n = 0)} + \sum_{i=1}^{j} \lambda_{\Phi(b_i)}$$

In the above, the extrinsic information (second term) can be interpreted as sum of messages ($\lambda_{\Phi(b_i)}$) from all the check nodes involving code bit $b_n$.

Using the min-sum approximation, the each of the extrinsic information can be approximated as, $$\lambda_{\Phi(b_i)} \approx s_{\Phi(b_i)} |\lambda_{min}(b_i)|$$

where, $$s_{\Phi(b_i)} = -\prod_{m=2}^{k} \text{sign}(-\lambda_{i,m})$$

$$|\lambda_{min}(b_i)| = \min_{m=2,\ldots k}(|\lambda_{i,m}|)$$

The structure of the code and the decoding criterion explained in the previous section can be used to distinguish low confidence and high confidence nodes, or in other words less reliable and more reliable nodes.

For at least some embodiments, nodes are classified based on the criterion that if a node having less intrinsic reliability is involved in multiple parity checks, then that node dominates the decision of the parity checks and secondly that node affects the extrinsic information of its neighboring bit nodes connected to a common check node. Such a bit node can be considered less reliable.

An example of a procedure for node classification based on the above embodiment includes the following steps. First, for each check node, find the most unreliable bit node with which it's associated, that is, the bit node with the lowest magnitude of the intrinsic information. Second, for every bit node, all the check nodes to which it is connected to are listed. Third, for each of the above check nodes (listed in the second step), check if the most unreliable bit node associated with the check node happens to be the bit node in question (based on the first step). If so, increment a counter specific to that bit node by 1. Fourth, the second step and the third step are repeated for all bit nodes. Fifth, bit nodes are classified as unreliable or bad, if their associated counter values are greater than a threshold $\Gamma_{M_1}$.

Figure 6:
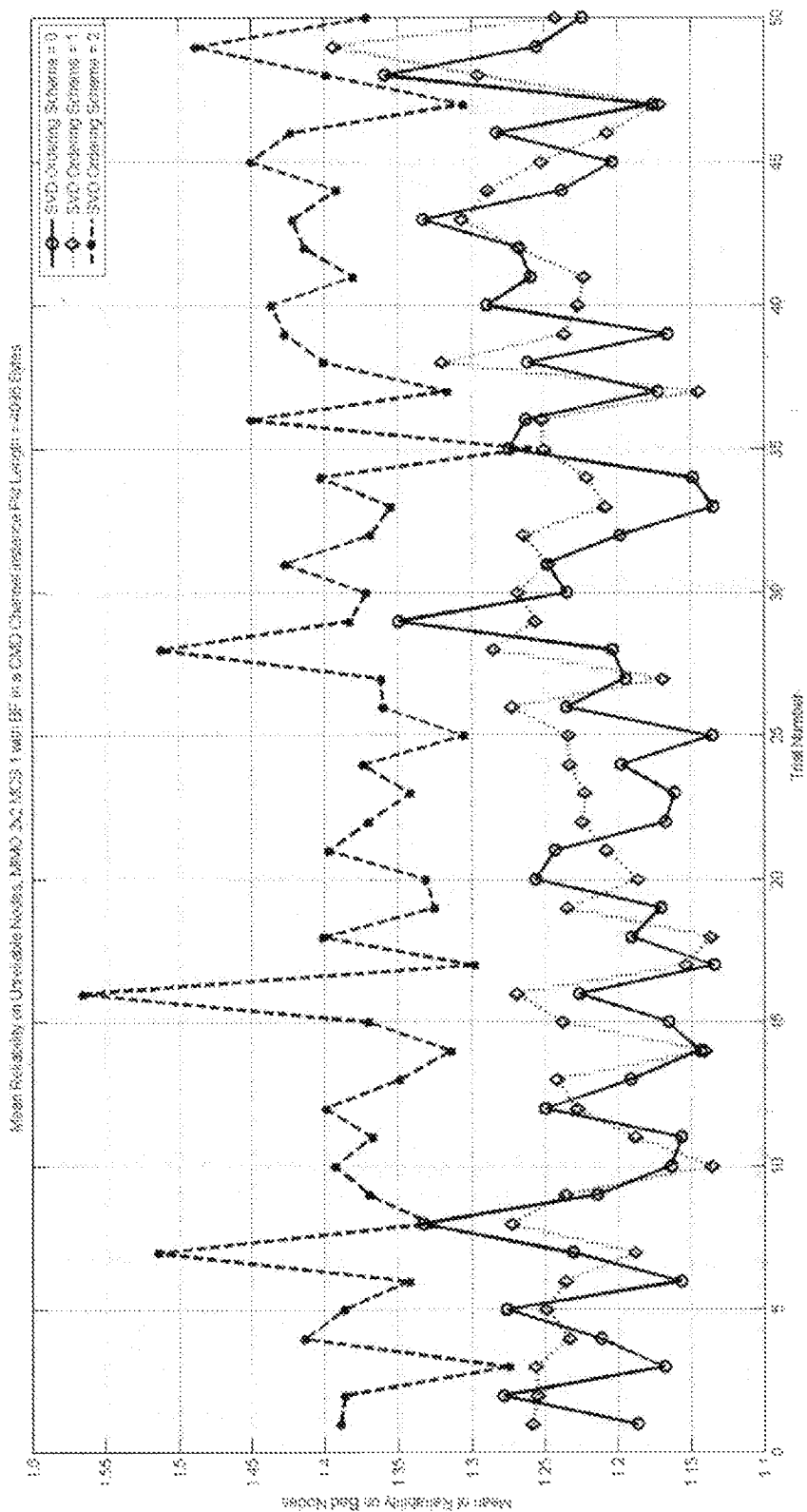
FIG. 6 shows a plot of the mean reliability of unreliable nodes as a function of the reordering scheme using an embodiment of a procedure for a CMD (Channel Model D) channel instance over different noise trials, according to an embodiment.

FIG. 6 shows a plot of the mean reliability of unreliable nodes as a function of the Reordering scheme using an embodiment of a procedure for a CMD (Channel Model D) channel instance over different noise trials, according to an embodiment.

For at least some embodiments, node classification is performed based on knowledge of both intrinsic and extrinsic information. The extrinsic information is not limited to an initial estimate but can evolve over multiple iterations in the decoding procedure. The idea is that if a bit node's extrinsic information, that is, the information gathered about a bit node from other connected bit nodes (neighbors) is large, then bit node's reliability can be easily increased. However if the extrinsic information and the intrinsic information of a bit node are poor, then it is possible that the bit node's reliability cannot be improved or may take multiple iterations to improve. Such a bit node is less reliable or has lower confidence.

For at least some embodiments, classifying the bit nodes includes the following steps. First, for every node, its intrinsic information is computed, i.e. information from the channel observation. The intrinsic information can be referred to as $I(b_n)$. Second, assuming a bit node is connected to j check nodes, each of the check nodes to which a bit node is connected provide extrinsic information, $E_j(b_n)$ about the bit node in question. Compute the largest of the magnitude of the extrinsic information provided by all the check nodes. The extrinsic information can be referred to as $BE(b_n)$ (where BE stands for Best Extrinsic), where $$BE(b_n) = \max_j(|E_j(b_n)|).$$

Fourth, a bit node is classified as un-reliable or of lower confidence if both, $|I(b_n)|$ and $BE(b_n)$ are below thresholds $\Theta_{M_2}^1$ and $\Theta_{M_2}^2$ respectively.

A modification to the above metric can also be made by choosing $$E(b_n) = \left|\sum_j E_j(b_n)\right|$$

instead of $BE(b_n)$. That is, the total extrinsic information from all j check nodes is utilized instead of the best.

Figure 7:
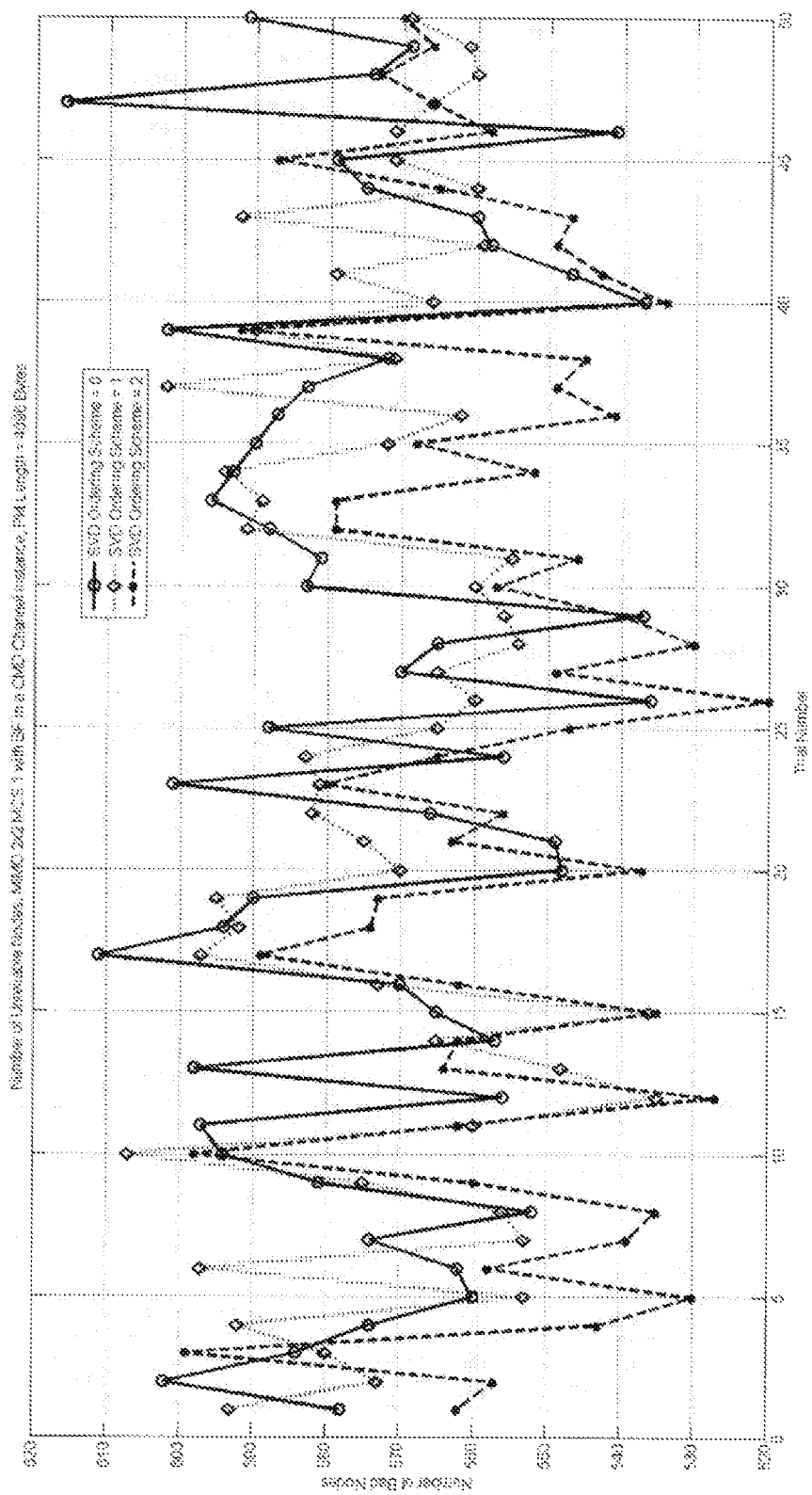
FIG. 7 shows a plot of the number of unreliable nodes for a CMD (Channel Model D) channel instance over different noise trials, according to an embodiment.

FIG. 7 shows a plot of the number of unreliable nodes for a CMD (Channel Model D) channel instance over different noise trials, according to an embodiment. Here, it can be observed that with reordering scheme 2, the mean number of bad nodes over noise trials is lower compared to that of other reordering schemes suggesting an improved PER performance compared to the other reordering schemes.

It is to be understood that at least some of the described embodiments that include node classifications may not use all information (for example, for reducing complexity) that a decoder may typically use. Such embodiments may be referred to as "predictive LLRs" define the information used to determine reliability of nodes.

At least some of the embodiments that include node classifications include the formation of one or more subsets of node with different confidence (reliabilities). For an embodiment, the nodes are classified into two sets, wherein the two sets include low confidence (less reliable) and high confidence (greater reliable) based on whether the calculated node reliabilities are below or above a pre-determined threshold.

At least some of the described embodiments can further be used to determine a mean reliability of a subset of nodes where the mean reliability of a subset of nodes is computed to be the average of the magnitudes of the predictive LLRs as computed in the above embodiments. In an embodiment, the mean reliability of a low confidence set is computed to determine an optimal reordering scheme.

For at least some embodiments, the node partitioning is extended to more than two subsets. For instance, the reliabilities could be classified as low, middle, and high. Accordingly, for at least some embodiments, the reordering schemes chosen is a function of the class of each node. Additionally, for at least some embodiments, the predictive LLRs is estimated or generated based on channel observations not only from current packet but also previous packet(s) as well. Also, for at least some embodiments, a priori information about the channel/signal/noise quality is utilized to improve the accuracy of the predicted LLR estimates.

At least some embodiments further include counting a number of elements within the low confidence subset for each of the column reordering permutations, and selecting a reordering permutation from the set of column reordering permutations based on the number of elements within the low confidence subset of each of the column reordering permutations. At least some embodiments include counting a number of elements within the low confidence subset for each of the column reordering permutations, and selecting a reordering permutation from the set of column reordering permutations that has the fewest elements within the low confidence subset of each of the column reordering permutations. At least some embodiments include counting a number of elements within the low confidence subset for each of the column reordering permutations, and selecting a reordering permutation from the set of column reordering permutations that has less than a threshold number of elements within the low confidence subset of each of the column reordering permutations.

At least some embodiments further include computing a mean reliability of the low confidence subset for each of the column reordering permutations, and selecting a reordering permutation from the set of column reordering permutations based on the mean reliability of the low confidence subset of each of the column reordering permutations. At least some embodiments include computing a mean reliability of the low confidence subset for each of the column reordering permutations, and selecting a reordering permutation from the set of column reordering permutations that has the greatest reliability of the low confidence subset of each of the column reordering permutations.

At least some embodiments further include computing number of elements of the low confidence subset having a reliability lower than a poor reliability threshold for each of the column reordering permutations, and selecting a reordering permutation from the set of column reordering permutations based on the computed number of elements of low confidence subset having reliability lower than the poor reliability threshold, for each of the set of column reordering permutations. At least some embodiments include computing number of elements of the low confidence subset having a reliability lower than a poor reliability threshold for each of the column reordering permutations, and selecting a reordering permutation from the set of column reordering permutations having the lowest number low confidence subsets having reliability lower than the poor reliability threshold, for each of the set of column reordering permutations. At least some embodiments include computing number of elements of the low confidence subset having a reliability lower than a poor reliability threshold for each of the column reordering permutations, and selecting a reordering permutation from the set of column reordering permutations having a number low confidence subsets having reliability lower than the poor reliability threshold less than a threshold, for each of the set of column reordering permutations.

At least some embodiments further include identifying a plurality of column reordering permutations, and selecting a one of the plurality of column reordering permutations based on a number of check nodes connected to a worst variable node having a reliability below a reliability threshold. For an embodiment, the worst variable node is defined as one if its intrinsic information, $I(b_n)$ is below a threshold $\Theta_{M_2}^1$. For another embodiment, the worst variable node is defined as one if its intrinsic information, $I(b_n)$ and its best extrinsic $BE(b_n)$ are below thresholds $\Theta_{M_2}^1$ and $\Theta_{M_2}^2$ respectively.

At least some embodiments further include identifying a plurality of column reordering permutations, and selecting a one of the plurality of column reordering permutations based on a percent of check nodes connected to a worst variable node having a reliability below a reliability threshold. For an embodiment, the worst variable node is defined as one if its intrinsic information, $I(b_n)$ is below a threshold $\Theta_{M_2}^1$. For another embodiment, the worst variable node is defined as one if its intrinsic information, $I(b_n)$ and its best extrinsic $BE(b_n)$ are below thresholds $\Theta_{M_2}^1$ and $\Theta_{M_2}^2$ respectively.

At least some embodiments further include identifying a plurality of column reordering permutations, and selecting a one of the plurality of column reordering permutations based on an average reliability of a worst variable node connected to each check node below a threshold. For an embodiment, the worst variable node is defined as one if its intrinsic information, $I(b_n)$ is below a threshold $\Theta_{M_2}^1$. For another embodiment, the worst variable node is defined as one if its intrinsic information, $I(b_n)$ and its best extrinsic $BE(b_n)$ are below thresholds $\Theta_{M_2}^1$ and $\Theta_{M_2}^2$ respectively.

At least some embodiments further include processing a plurality of multi-carrier signals using the final beamforming matrix, and transmitting the processed plurality of multi-carrier signals through a plurality of transmit chains of the multiple antenna transmitter.

For at least some embodiments, reordering columns of the initial beamforming matrix is further based on a signal characteristic, and wherein the columns of the initial beamforming matrix are re-ordered upon changes of the signal characteristic.

Figure 8:
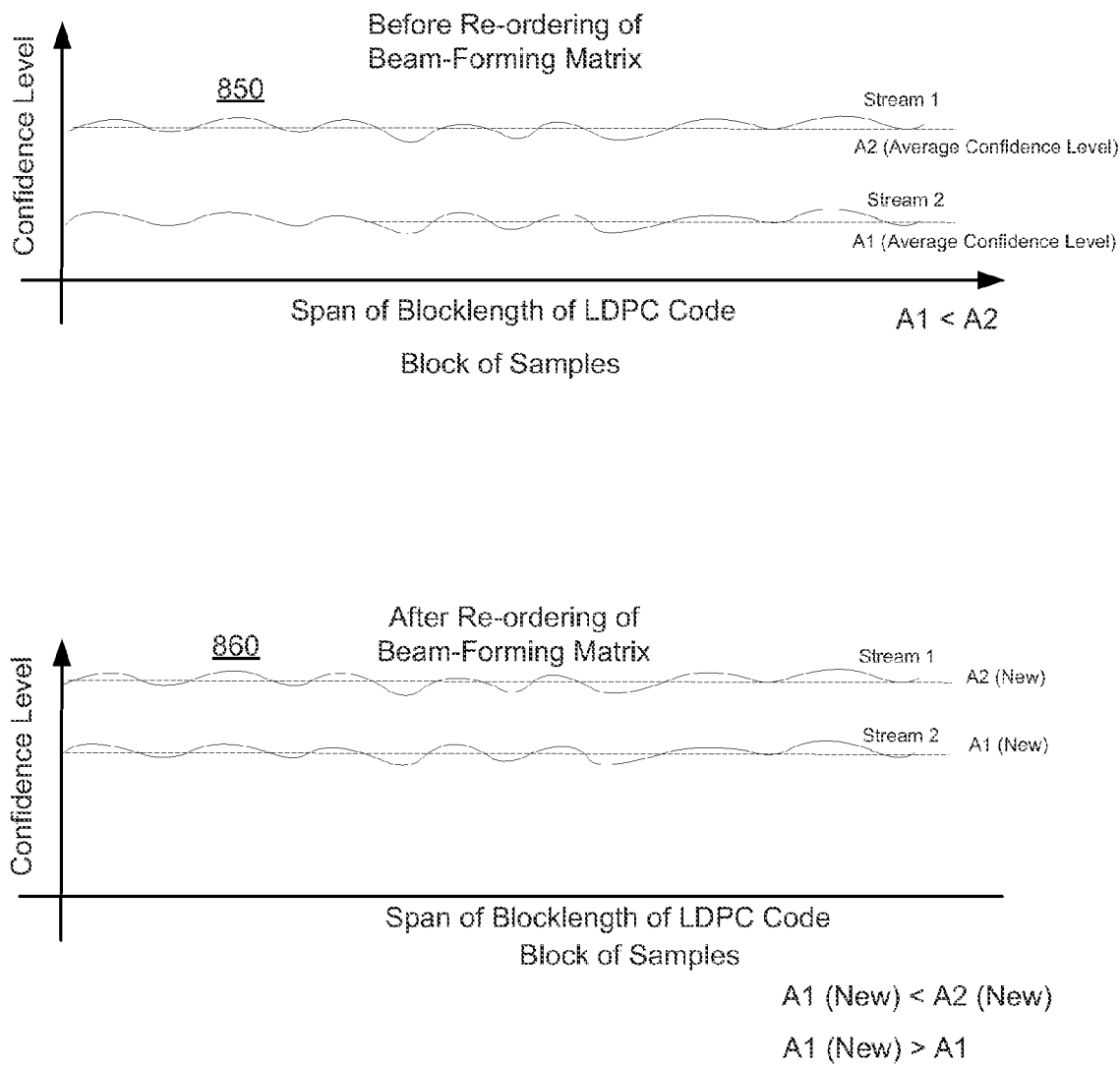
FIG. 8 shows confidence levels for blocks of samples for two spatial streams both before and after reordering of the beam-forming matrix, according to an embodiment.

FIG. 8 shows confidence levels for blocks of samples for two spatial streams both before and after reordering of the beam-forming matrix, according to an embodiment. At least some embodiments further include constructing a plurality of K demapped blocks of confidence levels based on singular values per subcarrier of a plurality spatial streams of the MIMO channel, wherein the confidence levels comprise functions of SNRs (signal to noise ratios), wherein each of the plurality of the K demapped blocks corresponds to a one of K encoded data streams of the multiple antenna transmitter, computing an average confidence level for each of the plurality of K demapped blocks, and identifying a lowest average confidence level of the plurality from the computed average confidence levels, wherein the reordering of the columns of the initial beamforming matrix of at least one of the subcarriers increases the lowest average confidence level. LDPC is a block code, and associated encoders and decoders operate on blocks of data.

As shown in FIG. 8, before reordering (850) of the beam-forming matrix, the confidence levels of two spatial streams (stream 1 and stream 2) have average levels of confidence of A1 and A2, wherein A1<A2. However, after reordering (860) of the beam-forming matrix, the confidence level A1 of at least the first stream (the stream having the lowest confidence level) is improved to A1 (New), wherein A1 (New)>A1, and further, A1 (New)<A2 (New).

Note that constructing the plurality of K (demapped) blocks may require tone demapping and stream deparsing in order to construct the blocks of confidence levels corresponding to each stream.

At least some embodiments further include selecting the reordering of the columns to reduce decoding errors at a receiver of the plurality of multi-carrier signals as compared to decoding errors at the receiver utilizing the initial beamforming matrix.

For an embodiment, the reordering of the columns of the initial beamforming matrix is performed based on a current packet of the multicarrier signals. For at least some embodiments, the beamforming matrix is computed based on the current packet. However, the beamforming matrix is not be applied until the next transmitted packet by the transmitting transceiver.

For least some embodiments, final beamforming matrix is determined at the receiver and transmitted back to the multiple antenna transmitter. For least some embodiments, final beamforming matrix is determined at the multiple antenna transmitter.

A semiconductor intellectual property core, such as a microprocessor core, or a portion thereof, fixed function circuitry, or configurable circuitry embodying the disclosure can be described in data stored on a machine readable medium. Such data can be in accordance with a Hardware Description Language (HDL), and may include Register Transfer Language (RTL) description data, for example. This descriptive data can be used to simulate, verify, and/or produce a specific implementation of the disclosure (e.g., an integrated circuit, or a combination of integrated circuit(s) and discrete components).

The disclosure explained example embodiments using block diagrams that, for example, show a flow of data through different functional blocks. To a person of ordinary skill in the relevant arts, the names given to these functional blocks also describe example structure for implementing those functions, without including unnecessary detail. These functional blocks can have varied implementations, including using fixed-function circuitry, partially configurable circuitry, special-purpose processors, such as digital signal processors, generally programmable processor cores, and combinations thereof. For example, some implementations may implement some of the depicted functional blocks using software configuring a processor, while others may use fixed-function circuitry. Since different implementations may use different physical hardware elements, the depiction of particular arrangements of functional blocks does not imply that implementations need to have separate structures implementing those functions. For example, a beam forming matrix multiplier can be implemented as a separate multiplier (such as, beam forming matrix multiplier 270) from processor 280, but such multiplier also could be implemented as a resource shared with other functional blocks, or a multiplier driven by decoded instructions from a processor (such as, processor 280).

This disclosure explains that a processor can perform certain aspects of methods according to the disclosure. Such processor can be a generally programmable processor, which can execute machine readable code according to an instruction set architecture. Such processor also can have more limited configurability, such as allowing configurability using supplied sets of parameters that modify execution of a set of sub-routines available from a non-volatile memory, for example. The processor also can include fixed-function circuitry, which can interoperate with programmable or configurable elements of the processor. When such a processor is configured to perform a function or action described in the disclosure, the processor effectively becomes circuitry for performing that function or action, even while the processor also can be circuitry for performing other functions or actions. As such, the term "circuitry" does not imply a single electrically connected set of circuits, and circuitry may be fixed-function, configurable, or programmable.

Although specific embodiments have been described and illustrated, the embodiments are not to be limited to the specific forms or arrangements of parts so described and illustrated. The described embodiments are to only be limited by the claims.

What is claimed:

1. A method of beamforming, comprising:
    generating a beamforming matrix, comprising;
        obtaining a channel matrix of a multiple-input, multiple-output (MIMO) channel between multiple transmitter antennas and at least one receiver antenna;
        determining an initial beamforming matrix based on a singular value decomposition of the channel matrix; and
        generating, by a transceiver, a final beamforming matrix comprising reordering columns of the initial beamforming matrix for at least one sub-carrier of a multi-carrier signal, wherein the reordering of the columns is based on knowledge of encoding of a transmit signal.

2. The method of claim 1, further comprising:
    identifying a set of column reordering permutations;
    partitioning every block of n input bit predictive log likely ratios (LLRs) to a low-density parity-check (LDPC) decoder into a low confidence subset or a high confidence subset for each of the set of column reordering permutations, wherein the LDPC decoder is decoding based on knowledge of LDPC encoding of the transmit signal.

3. The method of claim 2, further comprising:
    counting a number of elements within the low confidence subset for each of the set of column reordering permutations; and
    selecting a reordering permutation from the set of column reordering permutations based on the number of elements within the low confidence subset of each of the column reordering permutations.

4. The method of claim 2, further comprising:
    computing a mean reliability of the low confidence subset for each of the column reordering permutations; and
    selecting a reordering permutation from the set of column reordering permutations based on the mean reliability of the low confidence subset of each of the column reordering permutations.

5. The method of claim 2, further comprising:
    computing number of elements of the low confidence subset having a reliability lower than a poor reliability threshold for each of the column reordering permutations; and
    selecting a reordering permutation from the set of column reordering permutations based on the computed number of elements of the low confidence subset having reliability lower than the poor reliability threshold, for each of the set of column reordering permutations.

6. The method of claim 1, wherein the encoding of the transmit signal includes LDPC encoding, and further comprising:
    specifying a parity check matrix based on the LDPC encoding;
    generating a set of parity check bits, comprising multiplying a block of n input bits by the parity check matrix;
    wherein the input bits and any information associated with the input bits are denoted as a variable nodes; and
    wherein the parity check bits and any information associated with the parity check bits are denoted as check nodes.

7. The method of claim 6, further comprising:
    identifying a plurality of column reordering permutations;
    selecting a one of the plurality of column reordering permutations based on a number of check nodes connected to a worst variable node having a reliability below a reliability threshold.

8. The method of claim 6, further comprising:
    identifying a plurality of column reordering permutations;
    selecting a one of the plurality of column reordering permutations based on a percent of check nodes connected to a worst variable node having a reliability below a reliability threshold.

9. The method of claim 6, further comprising:
identifying a plurality of column reordering permutations;
selecting a one of the plurality of column reordering permutations based on an average reliability of a worst variable node connected to each check node below a threshold.

10. The method of claim 1, wherein reordering columns of the initial beamforming matrix is further based on a signal characteristic, and wherein the columns of the initial beamforming matrix are re-ordered upon changes of the signal characteristic.

11. The method of claim 1, further comprising:
constructing a plurality of K demapped blocks of confidence levels based on singular values per subcarrier of a plurality spatial streams of the MIMO channel, wherein the confidence levels comprise functions of SNRs (signal to noise ratios), wherein each of the plurality of K demapped blocks corresponds to a one of K encoded data streams of the multiple antenna transmitter;
computing an average confidence level for each of the plurality of K demapped blocks; and
identifying a lowest average confidence level of the plurality from the computed average confidence levels;
wherein the reordering of the columns of the initial beamforming matrix of at least one of the subcarriers increases the lowest average confidence level;
wherein K is an integer greater the 1.

12. The method of claim 1, further comprising selecting the reordering of the columns to reduce decoding errors at a receiver of the plurality of multi-carrier signals as compared to decoding errors at the receiver utilizing the initial beamforming matrix.

13. The method of claim 1, wherein a selected initial beamforming technique includes singular value decomposition (SVD), wherein the initial beamforming matrix includes at least one of Ascending Value SVD (AVSVD) that includes diagonal singular values in an increasing order, or Descending Value SVD (DVSVD) that includes diagonal singular values in a decreasing order.

14. The method of claim 13, wherein if the initial beamforming matrix comprises AVSVD, then the final beamforming matrix comprises DVSVD, and if the initial beamforming matrix comprises DVSVD, then the final beamforming matrix comprises AVSVD.

15. The method of claim 1, wherein the final beamforming matrix is determined at the transceiver and transmitted back to a transmitter associated with the multiple transmitter antennas.

16. The method of claim 1, wherein the final beamforming matrix is generated at the transceiver and the transceiver includes the multiple transmitter antennas.

17. A method of beamforming, comprising:
generating a beamforming matrix, comprising;
obtaining a channel matrix of a multiple-input, multiple-output (MIMO) channel between multiple transmitter antennas and at least one receiver antenna;
determining an initial beamforming matrix based on a singular value decomposition of the channel matrix; and
generating, by a transceiver, a final beamforming matrix comprising reordering columns of the initial beamforming matrix for at least one sub-carrier of a multi-carrier signal based on a signal characteristic, wherein the reordering of the columns is based on knowledge of encoding of a transmit signal.

18. An apparatus, comprising:
a plurality of receive chains;
a processor, wherein the processor is operative to:
obtain a channel matrix of a multiple-input, multiple-output (MIMO) channel between multiple transmitter antennas and at least one receiver antenna;
determine an initial beamforming matrix based on a singular value decomposition of the channel matrix; and
generate, by a transceiver, a final beamforming matrix comprising reordering columns of the initial beamforming matrix for at least one sub-carrier of a multi-carrier signal, wherein the reordering of the columns is based on knowledge of encoding of a transmit signal.

19. The apparatus of claim 18, wherein the processor is operative to:
facilitate processing a plurality of multi-carrier signals using the final beamforming matrix; and wherein
the apparatus is operative to
transmit the processed plurality of multi-carrier signals through a plurality of antennas of the multiple transmitter antennas.

20. The apparatus of claim 19, wherein the apparatus is operative to provide the final beamforming matrix to a second transceiver that includes the plurality of antennas of the multiple transmitter antennas.

21. The apparatus of claim 18, wherein the processor is further operative to:
identify a plurality of column reordering permutations;
partition every block of n input bit predictive LLRs to an LDPC decoder into a low confidence subset or a high confidence subset for each of the reordering permutations, wherein the LDPC decoder is based on knowledge of LDPC encoding of the transmit signal.

22. The apparatus of claim 21, wherein the processor is further operative to:
count a number of elements within the low confidence subset for each of the column reordering permutations; and
select a reordering permutation from the plurality of column reordering permutations based on the number of elements within the low confidence subset of each of the column reordering permutations.

23. The apparatus of claim 21, wherein the processor is further operative to:
compute a mean reliability of the low confidence subset for each of the column reordering permutations; and
select a reordering permutation from the plurality of column reordering permutations based on the mean reliability of the low confidence subset of each of the column reordering permutations.

24. The apparatus of claim 21, wherein the processor is further operative to:
compute number of elements of the low confidence subset having a reliability lower than a poor reliability threshold for each of the column reordering permutations; and
select a reordering permutation from the plurality of column reordering permutations based on the computed number of elements of the low confidence subset having reliability lower than the poor reliability threshold, for each of the column reordering permutations.

25. The apparatus of claim 18, wherein the encoding of the transmit signal includes LDPC encoding, and wherein the processor is further operative to:

specify a parity check matrix based on the LDPC encoding;

generate a set of parity check bits, comprising multiplying a block of n input bits by the parity check matrix;

wherein the input bits and any information associated with the input bits are denoted as a variable nodes; and wherein the parity check bits and any information associated with the parity check bits are denoted as check nodes.

26. The apparatus of claim 25, wherein the processor is further operative to:

identify a plurality of column reordering permutations;

select a one of the plurality of column reordering permutations based on a number of check nodes connected to a worst variable node having a reliability below a reliability threshold, wherein the worst variable node.

27. The apparatus of claim 25, wherein the processor is further operative to:

identify a plurality of column reordering permutations;

select a one of the plurality of column reordering permutations based on a percent of check nodes connected to a worst variable node having a reliability below a reliability threshold, wherein the worst variable node.

28. The apparatus of claim 25, wherein the processor is further operative to:

identify a plurality of column reordering permutations;

select a one of the plurality of column reordering permutations based on an average reliability of a worst variable node connected to each check node below a threshold, wherein the worst variable node.

29. The apparatus of claim 18, wherein the processor further is operative to:

construct a plurality of K demapped blocks of confidence levels based on singular values per subcarrier of a plurality spatial streams of the MIMO channel, wherein the confidence levels comprise functions of SNRs (signal to noise ratios), wherein each of the plurality of K demapped blocks corresponds to a one of K encoded data blocks of the multiple antenna transmitter;

compute an average confidence level for each of the plurality of K demapped blocks; and identify a lowest average confidence level of the plurality from the computed average confidence levels;

wherein the reordering of the columns of the initial beamforming matrix of at least one of the subcarriers increases the lowest average confidence level wherein K is an integer greater than 1.

30. The apparatus of claim 18, wherein the processor further is operative to adjust the reordering of columns, wherein the adjustment ensures that a maximum number of subcarriers across any spatial stream with a singular value less than a threshold is minimized.

31. The apparatus of claim 18, wherein the processor further is operative to select the reordering of the columns to reduce decoding errors at a receiver of the plurality of multicarrier signals as compared to decoding errors at the receiver utilizing the initial beamforming matrix.

* * * * *